United States Patent [19]
Hasegawa

[11] Patent Number: 5,646,440
[45] Date of Patent: Jul. 8, 1997

[54] INTERLAYER DIELECTRIC STRUCTURE FOR SEMICONDUCTOR DEVICE

[75] Inventor: Toshiaki Hasegawa, Kanagawa, Japan

[73] Assignee: Sony Corporation, Japan

[21] Appl. No.: 534,405

[22] Filed: Sep. 27, 1995

[30] Foreign Application Priority Data

Oct. 3, 1994 [JP] Japan .................................. 6-238821
Jan. 13, 1995 [JP] Japan .................................. 7-003727

[51] Int. Cl.⁶ .................................................. H01L 23/58
[52] U.S. Cl. .......................................... 257/635; 257/637
[58] Field of Search ............................. 257/636, 637, 257/539, 640, 642, 643, 758, 635

[56] References Cited

U.S. PATENT DOCUMENTS

| | | | |
|---|---|---|---|
| 4,990,993 | 2/1991 | Tsurumaru | 257/643 |
| 5,055,906 | 10/1991 | Mase et al. | 257/643 |
| 5,117,278 | 5/1992 | Bellersen et al. | 257/642 |
| 5,430,329 | 7/1995 | Harada et al. | 257/643 |

FOREIGN PATENT DOCUMENTS

| | | | |
|---|---|---|---|
| 56-167333 | 12/1981 | Japan | 257/643 |
| 63-007650 | 1/1988 | Japan . | |
| 2-30138 | 1/1990 | Japan | 257/643 |
| 4-323854 | 11/1992 | Japan | 257/643 |

OTHER PUBLICATIONS

Alcorn et al, "Self-Aligned Silicon Nitride Polyimide Double Stop via Hole", Tech Disclosure Bulletin (IBM) vol. 27, No. 7A, Dec. 1984, pp. 3990-3993.

Primary Examiner—Mahshid D. Saadat
Assistant Examiner—S. V. Clark
Attorney, Agent, or Firm—Ronald P. Kananen

[57] ABSTRACT

A semiconductor device having a base or main body on which conductive interconnects are formed. At least the surface of the base is insulative. A first dielectric film is formed so as to cover the conductive interconnects. A second dielectric film having a relative dielectric constant smaller than that of the first dielectric film is formed at least between the conductive interconnects. The thickness of the second dielectric film between the conductive interconnects is greater than the height of the conductive interconnects by 10-100% in the directions of the height and depth. Films made of a material of a low dielectric constant are formed over and under the conductive interconnects via the first dielectric film or equivalent films.

28 Claims, 9 Drawing Sheets

INTERLAYER DIELECTRIC STRUCTURE FOR SEMICONDUCTOR DEVICE

BACKGROUND OF THE INVENTION

1. Field of the Invention

The present invention relates to a semiconductor device having high-density conductive interconnects and, more particularly, to a semiconductor device structure for realizing low electric power consumption and high-speed operation.

2. Description of the Related Art

As a means for accomplishing reductions in semiconductor device size, reductions in electric power consumption, and increases in operation speed, making lower the dielectric constants of interlayer dielectric films has been proposed. One example of this is disclosed in Japanese Patent Laid-Open No. 7650/1988 (Laid-Open Date: Jan. 13, 1988). In particular, a dielectric film between conductive interconnects is made from a low dielectric constant material having a relative dielectric constant smaller than that of dielectric films formed, respectively, over and under the conductive interconnects. Furthermore, in this structure, the dielectric film which is located between the conductive interconnects and has a low relative dielectric constant is in direct contact with the conductive interconnects.

Often, the aforementioned low dielectric constant material consists of a dielectric film to which carbon is added to reduce the dielectric constant down to about 1.5 to 2.5. Alternatively, an organic material such as polyimide, polyparaxylylene, or polysiloxane is used. Fabrication of semiconductor devices of the interlayer dielectric film structure using these materials has been discussed.

A known method of fabricating a semiconductor device which has an interlayer dielectric film in direct contact with conductive interconnects is described by referring to the schematic cross sections of FIG. 1(a)–1(c). The interlayer dielectric film is made of a low dielectric constant material containing carbon. In FIG. 1(a), the dielectric film, indicated by 13, is formed on a semiconductor substrate 12. Metallization 14 is deposited as a film on the dielectric film 13. The dielectric film 13 is formed $SiO_2$ to a thickness of about 0.5 μm by CVD, sputtering, or other techniques. The metallization 14 is aluminum (Al) having a small specific resistance and deposited to a thickness of about 0.5 μm.

The state shown in FIG.. 1(b) is obtained by forming a resist pattern by a lithographic method (not shown) and then etching the dielectric film 13 and the metallization 14 at the same time by a dry etching process. In the dry etching process, $CCl_4$ is normally used to etch the Al. A mixture of $CF_4$ and $H_2$ or other material is employed to etch the dielectric film of the $SiO_2$.

In the state shown in FIG. 1(c), a dielectric film 16 having a relative dielectric constant smaller than that of the dielectric film 13 is buried. This dielectric film 16 consists of polytetrafluoroethylene, polyethylene, or the like.

However, the dielectric film which is used in the prior art techniques and made from a low dielectric constant material containing carbon shows hygroscopicity and so the moisture resistance is poor. Therefore, especially in aluminum interconnects, corrosion takes place, thus deteriorating the reliability of the finished semiconductor device. Furthermore, the plasma resistance is not satisfactory. Especially, the dielectric film is vulnerable to oxygen plasma. Hence, it is difficult to use this dielectric film as an interlayer dielectric film in a semiconductor device.

OBJECTS AND SUMMARY OF THE INVENTION

It is a first object of the present invention to provide an interlayer dielectric film structure which is for use in a semiconductor device and which permits a low dielectric constant film having neither excellent hygroscopicity nor excellent plasma resistance to be used as an interlayer dielectric film and which improves the reliability of conductive interconnects. It is an additional object of the invention to provide an interlayer dielectric film structure which is for use in a semiconductor device and which accomplishes low electric power consumption and high-speed operation with high-density conductive interconnects.

It is a second object of the invention to realize an interlayer dielectric film structure which is for use in a semiconductor device and which has a main body, a first dielectric film, and a second dielectric film formed at least between conductive interconnects. The main body is used for fabricating a semiconductor device. At least the surface of the main body is insulative. The first dielectric film is formed on the main body so as to cover the conductive interconnects formed over the main body. The second dielectric film has a relative dielectric constant smaller than that of the first dielectric film.

It is a third object of the invention to realize an interlayer dielectric film structure which is similar to the structure described in the immediately preceding paragraph but which is further characterized in that the thickness of the second dielectric film is larger than the height of the conductive interconnects by 10–100% in the directions of the height and depth.

It is a fourth object of the invention to realize an interlayer dielectric film structure which is similar to the structure described in the immediately preceding paragraph but which is further characterized in that a third dielectric film having substantially the same relative dielectric constant as the first dielectric film is formed under the conductive interconnects, and that a fourth dielectric film having a thickness of 10–30% of the height of the conductive interconnects and having substantially the same relative dielectric constant as the second dielectric film is formed under the third dielectric film.

It is a fifth object of the invention to realize an interlayer dielectric film structure which is characterized in that the above-described third dielectric film consists of at least one of silicon oxide, silicon oxynitride, and silicon nitride, and that the fourth dielectric film consists of at least one of silicon oxide, silicon oxide containing fluorine, polysiloxane materials, parylene, fluorocarbon materials, and polyimide materials.

It is a sixth object of the invention to realize an interlayer dielectric film structure which is characterized in that a fifth dielectric film is formed over the above-described conductive interconnects via the first dielectric film, and that the fifth dielectric film consists of at least one of silicon oxide, silicon oxide containing fluorine, polysiloxane materials, polyparaxylylene, fluorocarbon materials, and polyimide materials. This structure is further characterized in that the thickness of the fifth dielectric film is more than 10% and less than 30% of the height of the conductive interconnects and has substantially the same relative dielectric constant as the second dielectric film.

It is a seventh object of the invention to realize an interlayer dielectric film structure which is for use in a semiconductor device and which is characterized in that a plurality of first dielectric films of the structure described above are formed, and that each of the first dielectric films consists of at least one of silicon oxide, silicon oxynitride, and silicon nitride.

It is an eighth object of the invention to realize an interlayer dielectric film structure which is for use in a semiconductor device and which is characterized in that a plurality of second dielectric films of the structure described above are formed and each second dielectric film consists of at least one of silicon oxide, silicon oxide containing fluorine, polysiloxane materials, polyparaxylylene, fluorocarbon materials, and polyimide materials.

In these interlayer dielectric film structures for use in semiconductor devices, the first dielectric film is formed so as to cover the conductive interconnects. Therefore, the conductive interconnects are protected from corrosion and poisoned vias due to the second dielectric film of low dielectric constant. Furthermore, the second dielectric film having a relative dielectric constant smaller than that of the first dielectric film is formed at least between the conductive interconnects and so the capacitance between the conductive interconnects decreases. In this way, a semiconductor device structure and fabrication method which accomplish low electric power consumption and high-speed operation with high-density conductive interconnects are disclosed.

Other objects and features of the invention will appear in the course of the description thereof, which follows.

DETAILED DESCRIPTION OF THE PREFERRED EMBODIMENTS

Figure 1A:
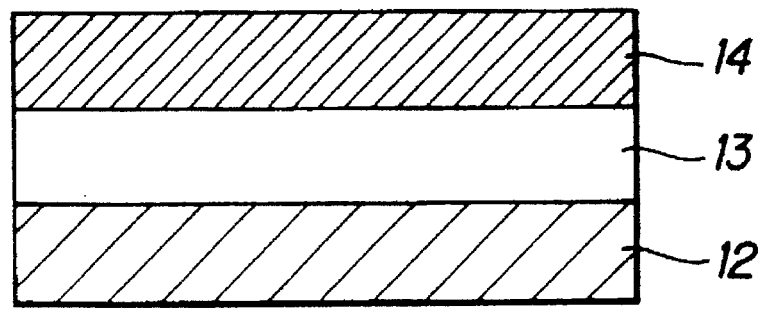
FIG. 1A is a cross-sectional view of the prior art structure obtained when a dielectric film 13 and metallization 14 are deposited over a semiconductor substrate.
Figure 1B:
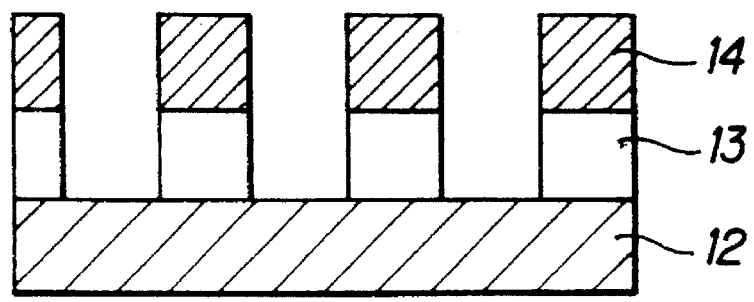
FIG. 1B is a cross-sectional view similar to FIG. 1A, but in which a dry etching process has been performed after the dielectric film 13 and the metallization 14 over the semiconductor substrate have been patterned with a resist.
Figure 1C:
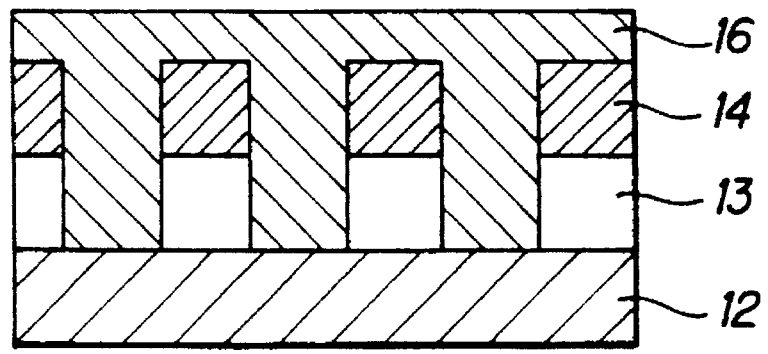
FIG. 1C is a cross-sectional view similar to FIG. 1B, but in which a dielectric film 16 having a relative dielectric constant smaller than that of the dielectric film 13 has been buried.
Figure 2:
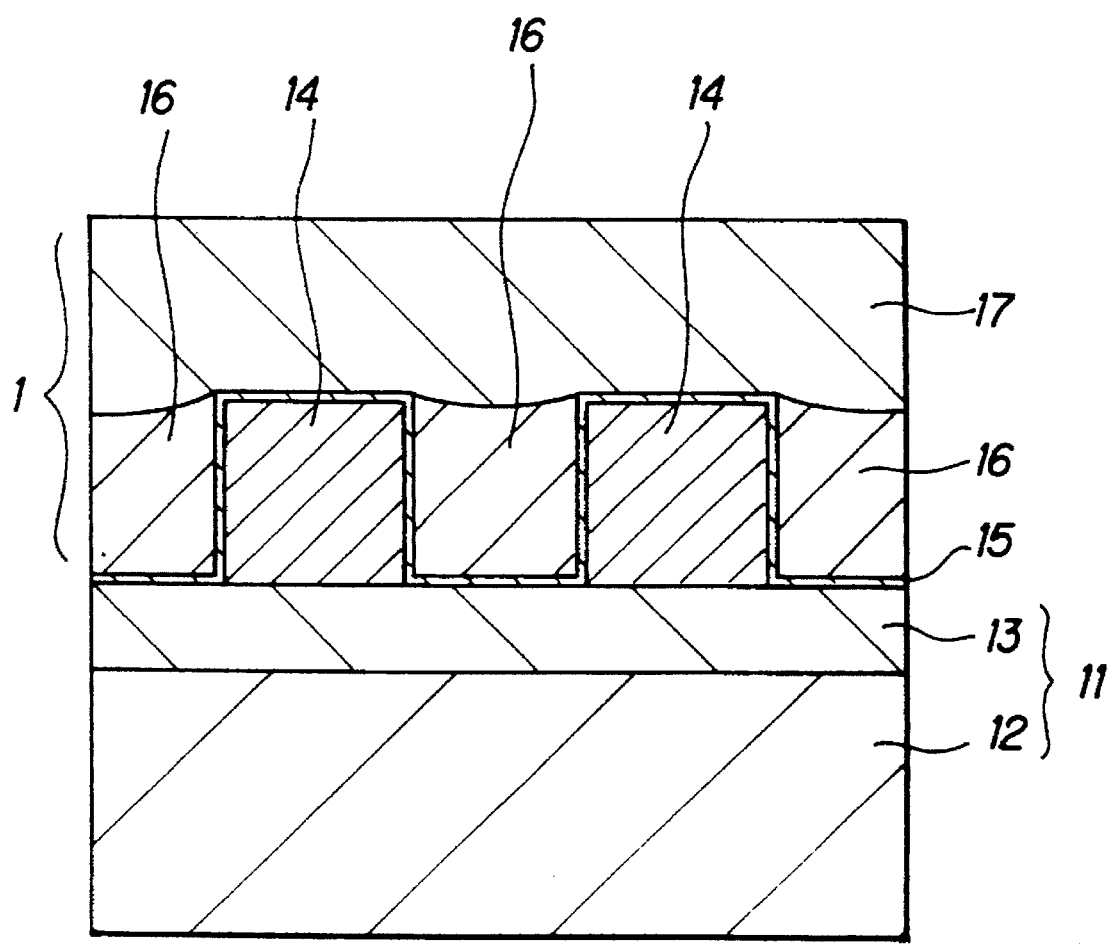
FIG. 2 is a schematic cross-sectional view of the structure of a first example of the present invention.

A first example of the present invention is now described by referring to the schematic cross section of FIG. 2.

As shown in FIG. 2, a base or main body 11 comprises a semiconductor substrate 12, for example, on which a lower dielectric layer 13 consisting of silicon oxide (e.g., having a relative dielectric constant of 4.0) is formed. For example, a plurality of conductive interconnects 14 are formed over the lower dielectric layer 13 of the base 11.

A first dielectric film 15 is formed so as to cover the conductive interconnects 14. This first dielectric film 15 is made of silicon oxide (e.g., having a relative dielectric constant of 4.0) having a film thickness of 2 nm. Alternatively, the film is made of silicon oxynitride (e.g., having a relative dielectric constant of 4.0–6.0) or silicon nitride (e.g., having a relative dielectric constant of 6.0).

A second dielectric film 16 having a relative dielectric constant smaller than that of the first dielectric film 15 is formed between the conductive interconnects 14 via the first dielectric film 15. Also, the second dielectric film 16 is formed over the lower dielectric layer 13 which is on one side of the conductive interconnects 14. In the present figure, the second dielectric film 16 is formed over the lower dielectric layer 13 via the first dielectric film 15 but the second dielectric film 16 may be formed directly on the lower dielectric layer 13. That is, it is only necessary that the first dielectric layer 15 be present at least between each conductive interconnect 14 and the second dielectric film 16.

The aforementioned second dielectric film 16 is made of polysiloxane based polymer (e.g., having a relative dielectric constant of 2.8). Alternatively, the film is made of silicon oxide containing fluorine atoms (e.g., having a relative dielectric constant of 3.0) or polyimide consisting of a polyimide material (e.g., having a relative dielectric constant of 3.0).

An upper dielectric layer 17 consisting, for example, of silicon oxide (e.g., having a relative dielectric constant of 4.0) is formed over the first and second dielectric films 15 and 16, respectively.

As mentioned previously, the interlayer dielectric film 1 is formed by the first and second dielectric films 15 and 16, respectively, and by the upper dielectric layer 17 so as to cover the conductive interconnects 14.

A method of fabricating the above-described interlayer dielectric film structure is briefly described. The conductive interconnects 14 are formed over the semiconductor substrate 12 by ordinary conductive interconnect formation techniques. The lower dielectric layer 13 is formed on the front surface of the substrate 12. Then, the first dielectric film 15 is formed over the lower dielectric layer 13 so as to cover the surfaces of the conductive interconnects 14, for example, by ECR (electron cyclotron resonance) CVD. As one example of the film formation conditions, silane (SiH$_4$) and nitrous oxide (N$_2$O) are used as reactant gases. Nitrogen (N$_2$) is used as a carrier gas. The RF power is set to 500 W. The substrate temperature is set to 400° C.

After forming the first dielectric film 15 under these conditions, a polysiloxane based polymer is applied to form the second dielectric film 16. The polymer given by Eq. (1) is used as this polysiloxane based polymer.

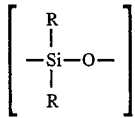

(R = CH$_3$, CH = CH$_2$, C$_6$H$_5$, etc.)

Then, the second dielectric film 16 is etched back, for example by ECR etching, until the first dielectric film 15 over the conductive interconnects 14 are exposed. As a result, the second dielectric film 16 exists at least between the conductive interconnects 14. Thereafter, the upper dielectric layer 17 is formed out of silicon oxide over the first and second dielectric films 15 and 16, respectively, by CVD.

In the above-described interlayer dielectric film structure for a semiconductor device, the first dielectric film 15 is formed so as to cover the conductive interconnects 14 and so the interconnects 14 are protected from corrosion and poisoned vias due to the second dielectric film of low dielectric constant. Furthermore, since the second dielectric film 16 of a relative dielectric constant lower than that of the first dielectric film 15 is formed at least between the conductive interconnects 14, the electric field set up by the conductive interconnects passes through the second dielectric film 16 of low dielectric constant. Therefore, the capacitance between the conductive interconnects 14 is reduced.

Figure 3:
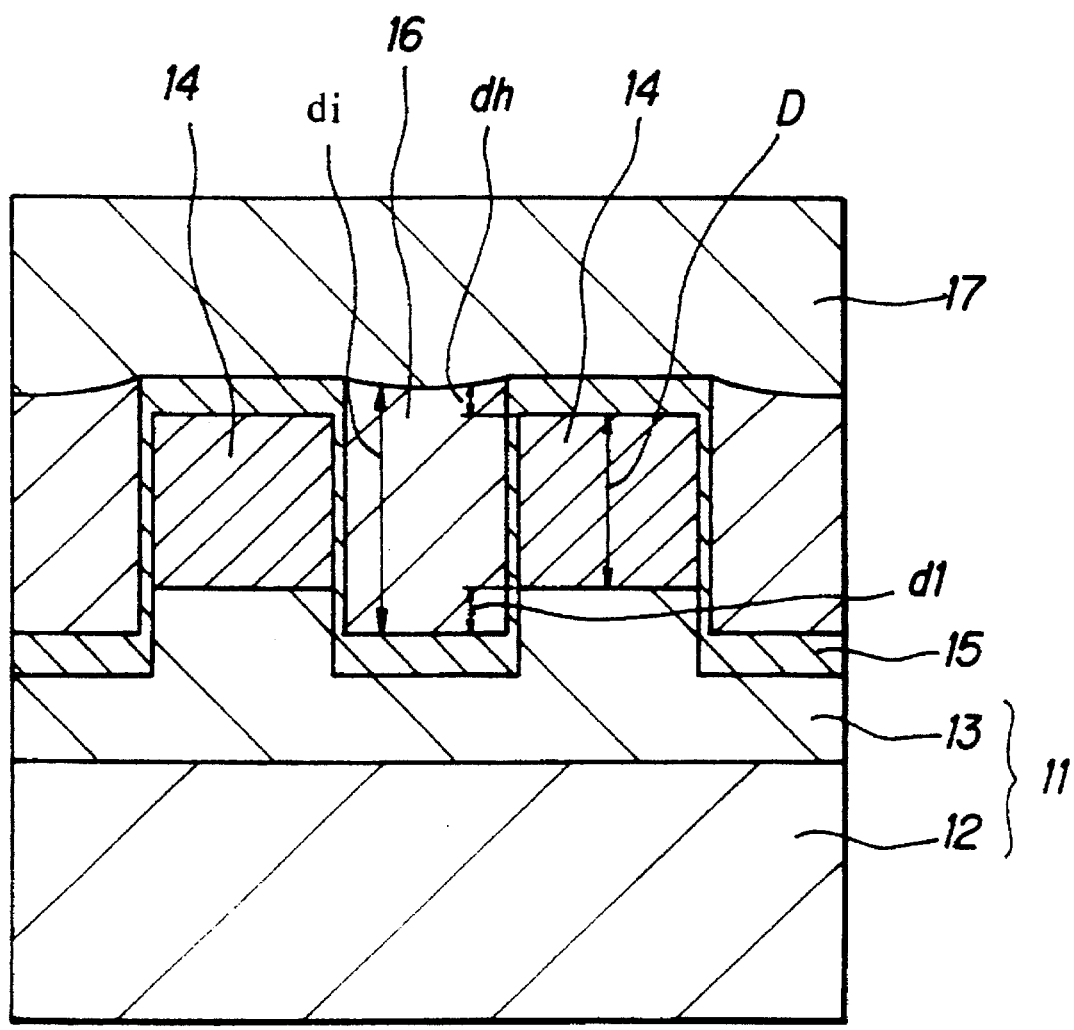
FIG. 3 is a schematic cross-sectional view of the structure of a second example of the invention.

A second example is next described by referring to the schematic cross section of FIG. 3. In this figure, those components which are the same as their counterparts of FIG. 2 are indicated by the same reference numerals.

As shown in FIG. 3, this interlayer dielectric film structure is similar to the structure shown in FIG. 2 except that the thickness of the second dielectric film 16 is larger than the height of the conductive interconnects 14 by 10–100% in the directions of the height and depth. That is, of the thickness di of the second dielectric film 16, the thickness dh of the portion higher than the conductive interconnects 14 and the thickness dl of the portion lower than the conductive interconnects 14 are set to 10–100% of the height D of the conductive interconnects 14.

In the same manner as described already in the first example, the base or main body 11 consists of the semiconductor substrate 12 having the lower dielectric layer 13 formed on its surface. The first dielectric film 15 is formed so as to cover the conductive interconnects 14. The upper dielectric layer 17 is formed over the first and second dielectric films 15 and 16, respectively.

The method of fabrication of the interlayer dielectric film structure of the above-described second example is carried out by the same process as described in the first example. However, the difference with the process of the first example is that when the conductive interconnects 14 are patterned by etching, the lower dielectric layer 13 is also etched. The etching depth of the lower dielectric layer 13 is determined in the manner described below. Let de be the etching depth of the lower dielectric layer 13. Let dl be the thickness of the first dielectric film 15 which will be deposited later over the etched portions in the lower dielectric layer 13. Let D be the height of the conductive interconnects 14. The lower dielectric layer 13 is so etched that the relation de–dl=0.1D to 1.0D holds.

ECR (electron cyclotron resonance) CVD is used to form the first dielectric film 15. The first dielectric film 15 is deposited over the etched portions in the lower dielectric layer 13 and over the conductive interconnects 14 to a thickness larger than side walls of the conductive interconnects 14.

In the second example, the thickness of the second dielectric film 16 between the conductive interconnects 14 is larger than the height D of the conductive interconnects 14 by 10–100% in the directions of the height and depth. Therefore, the capacitance between the conductive interconnects 14 is made lower than in the first example, because the electric field generated by the conductive interconnects 14 can pass more easily.

If the excessive thick portion is less than 10%, the path of the electric field produced by the conductive interconnects 14 is not limited to the second dielectric film 16. Therefore, capacitance is created between the conductive interconnects 14. This makes it impossible to sufficiently lower the capacitance. On the other hand, if the excessive portion is greater than 100%, the step becomes steep. In consequence, the burying characteristics of the second dielectric film 16 is deteriorated under the present situations. As a result, the amount is set to the above-described range.

Figure 4:
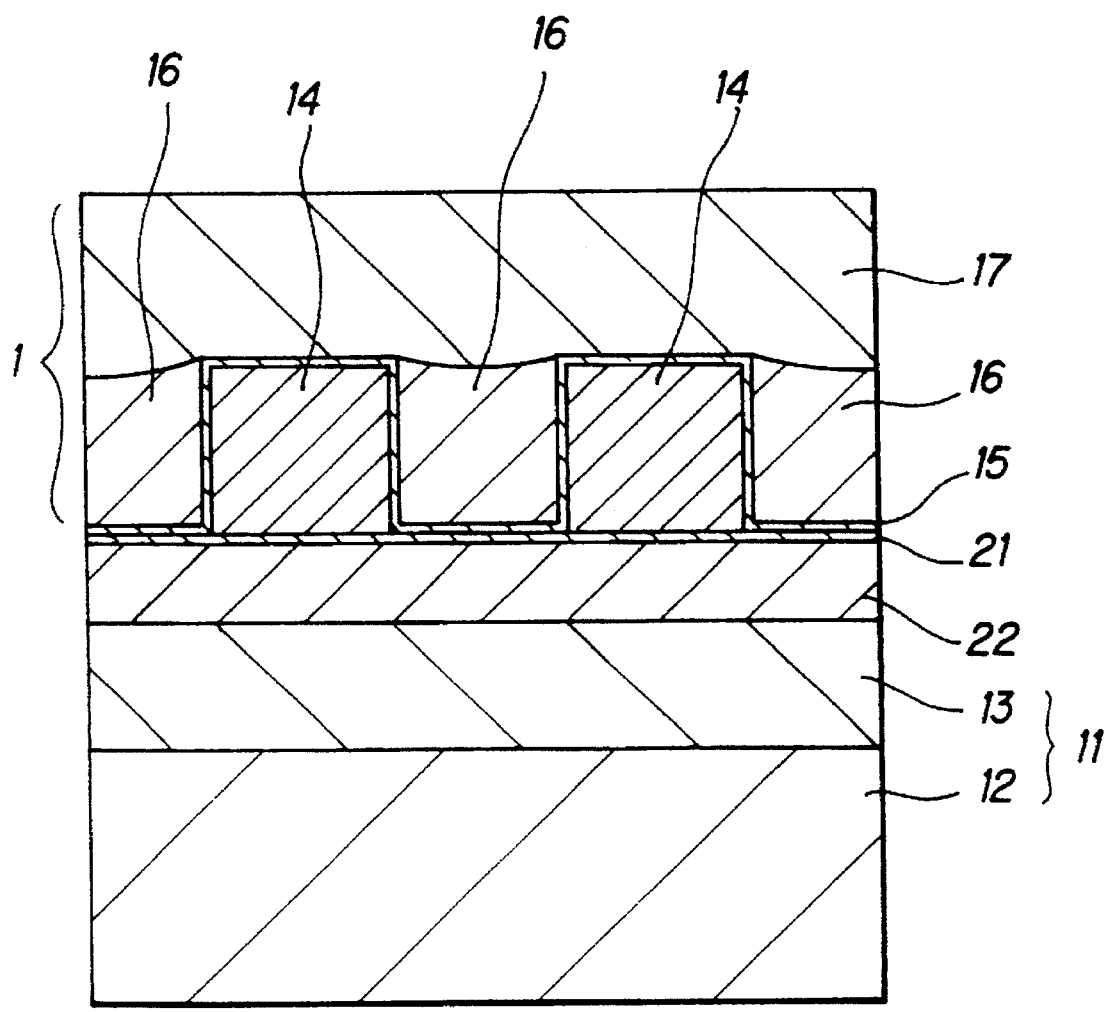
FIG. 4 is a schematic cross-sectional view of the structure of a third example of the invention.

A third example is next described by referring to the schematic cross section of FIG. 4. In this figure, those components which are the same as their counterparts of FIG. 2 are indicated by the same reference numerals.

As shown in FIG. 4, this interlayer dielectric film structure is similar to the structure shown in FIG. 2 except that a third dielectric film 21 and a fourth dielectric film 22 are formed under the conductive interconnects 14. This third dielectric film 21 has substantially the same relative dielectric constant as the first dielectric film. Examples of the material include silicon oxide, silicon oxynitride, and silicon nitride. On the other hand, the thickness of the fourth dielectric film 22 is more than 10% and less than 30% of the height of the conductive interconnects 14. The fourth dielectric film 22 has substantially the same relative dielectric constant as the second dielectric film 16 as described previously in the first example. This fourth dielectric film 22 consists of at least one of silicon oxide containing fluorine, polysiloxane materials, polyparaxylylene, fluorocarbon materials, and polyimide materials.

This structure is similar to the structure already described in connection with FIG. 2 in other respects. That is, the base or main body ii consists of the semiconductor substrate 12 having the lower dielectric layer 13 formed on its surface. The conductive interconnects 14 are formed over the lower dielectric layer 13 via the fourth and third dielectric films 22, 21, respectively. The first dielectric film 15 is formed so as to cover the conductive interconnects 14. The upper dielectric layer 17 is formed over the first and second dielectric films 15, 16, respectively. The interlayer dielectric film 1 is constructed in this way.

In the above-described structure, of the first dielectric film 15 and the third dielectric film 21 between the conductive interconnects 14, those portions which are not in direct contact with the conductive interconnects 14 are not required to be formed. Therefore, the first dielectric film 15 and the third dielectric film 21 may be formed so as to surround the conductive interconnects 14.

The method of fabrication of the interlayer dielectric film structure of the above-described third example is carried out by a process similar to the process previously described in the first example. However, the difference with the process of the first example is that the fourth dielectric film 22 and the third dielectric film 21 are successively stacked over the lower dielectric layer 13 before the conductive interconnects 14 are formed. First, by the spin coating, the fourth dielectric film 22 is applied over the lower dielectric layer 13 to a film thickness of 100 nm. Subsequently, the third dielectric film 21 is formed to a film thickness, for example, of 10 nm by ECR CVD. Then, the conductive interconnects 14 are formed by metallization formation techniques, followed by execution of the process already described in the first example.

It is also possible to fabricate it by a separate process. This process is characterized in that the first and fourth dielectric films at the bottoms of the conductive interconnects are removed.

Figure 5A:
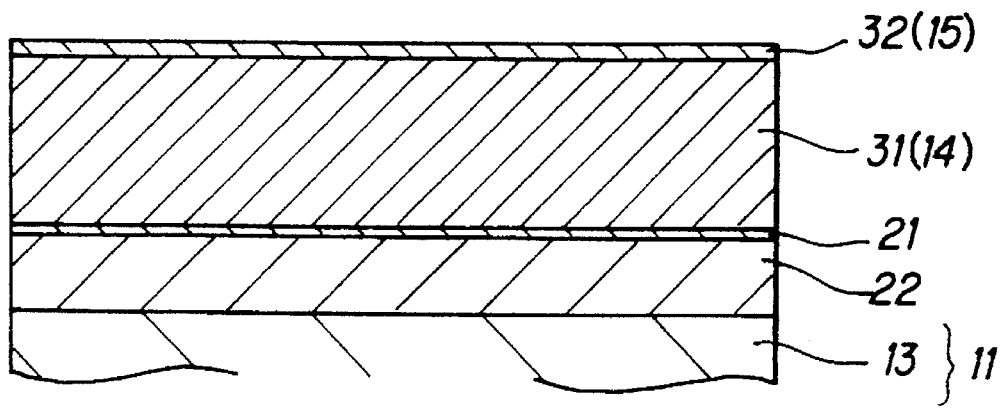
FIG. 5A is a cross-sectional view illustrating one fabrication process of the third example of the invention, and in which dielectric films and metallization have been deposited.

In particular, as shown in FIG. 5A, before the conductive interconnects 14 are formed, a fourth dielectric film 22 is formed over the lower dielectric layer 13 of the base 11, for example, to a film thickness of 100 nm by an application method. Then, a third dielectric film 21 is formed, for example, to a film thickness of 10 nm by ECR CVD. Subsequently, a metallization film 31 for forming the conductive interconnects 14 are formed by sputtering. Then, a dielectric film 32 becoming the first dielectric film 15 is formed on the metallization film 31 by CVD.

Figure 5B:
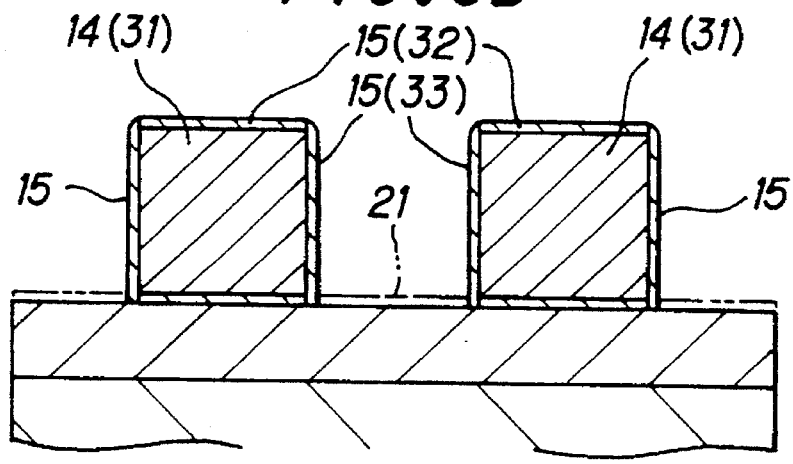
FIG. 5B is a cross-sectional view similar to FIG. 5A, but in which the side walls of conductive interconnects have been coated with a dielectric film 15 after the dielectric films and metallization have been patterned.

Then, a patterning step using ordinary lithography and etching techniques is carried out to form the conductive interconnects 14 from the metallization film 31 as shown in FIG. 5B. At this time, the dielectric film 32 becoming the first dielectric film 15 is left over the conductive interconnects 14. The third dielectric film 21 at the bottoms of the conductive interconnects 14 are etched away.

Thereafter, side walls 33 becoming the first dielectric film 15 are formed on the side walls of the conductive interconnects 14 by ordinary side wall formation techniques making use of formation of a dielectric film (not shown) for the side walls and etch-back. Of course, the dielectric film for the side walls between the conductive interconnects 14 is removed during the etch-back for forming the side walls 33. The dielectric film overlying the conductive interconnects 14 and used for the side walls is also removed. However, at least the bottom portion of the dielectric film 32 remains. Therefore, the conductive interconnects 14 are covered with the first dielectric film 15 consisting of the dielectric film 32 left on the conductive interconnects 14 and the side walls 33.

Figure 5C:
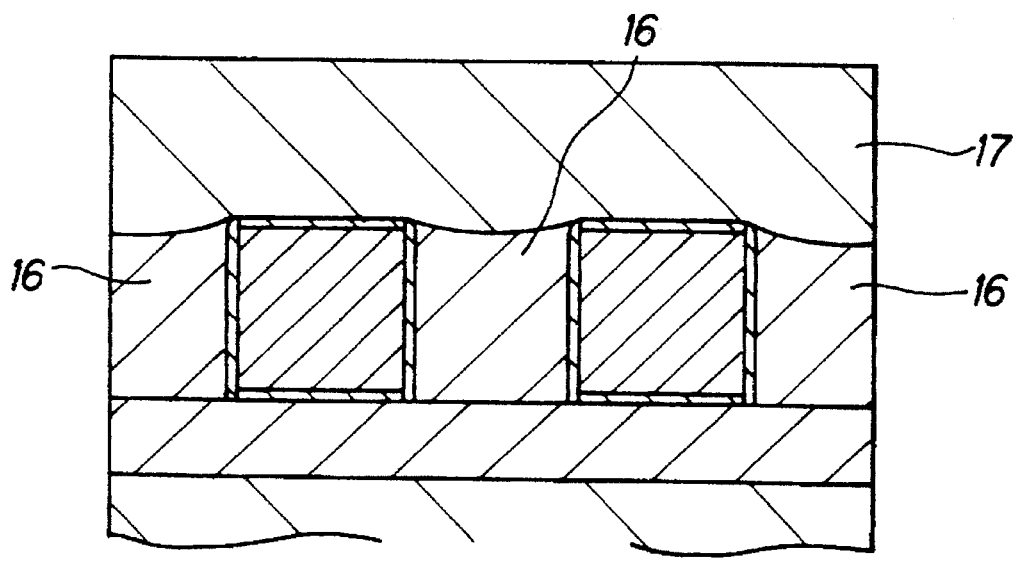
FIG. 5C is a cross-sectional view similar to FIG. 5B, but in which an upper dielectric film 17 has been deposited after spaces between the conductive interconnects are buried with a material having a low dielectric constant.

Thereafter, the process described in the first example is carried out to form the second dielectric film 16 and the upper dielectric layer 17 as shown in FIG. 5C.

If the interlayer dielectric film structure is formed by the process described above, the second dielectric film 16 is directly connected with the fourth dielectric film 22.

In the above-described third example, the third dielectric film 21 and the fourth dielectric film 22 are formed under the conductive interconnects 14 and so the third dielectric film 21 having substantially the same relative dielectric constant as the first dielectric film 15 protects the conductive interconnects 14 from corrosion and poisoned vias due to the fourth dielectric film 22 of low dielectric constant. Because the thickness of the fourth dielectric film 22 is more than 10% and less than 30% of the height of the conductive interconnects 14, and because the fourth dielectric film 22 has substantially the same relative dielectric constant as the second dielectric film 16, the electric field produced by the conductive interconnects 14 passes through the fourth dielectric film 22 of low dielectric constant. Consequently, the capacitance between the conductive interconnects 14 is reduced.

If the thickness of the fourth dielectric film 22 is lower than 10% of the height of the conductive interconnects 14, the electric field developed by the conductive interconnects 14 hardly passes through the fourth dielectric film 22 but passes through the lower dielectric layer 13. Consequently, the capacitance is reduced less efficiently. On the other hand, if the thickness is in excess of 30%, the moisture resistance is adversely affected, because the film quality of the fourth dielectric film 22 is poor. When a thermal step is effected, if the fourth dielectric film 22 contains carbon, hydrocarbon gases are produced. This renders the film porous. For this reason, the moisture resistance is further deteriorated. Accordingly, the film thickness of the fourth dielectric film 22 is set to the above-described range.

Figure 6:
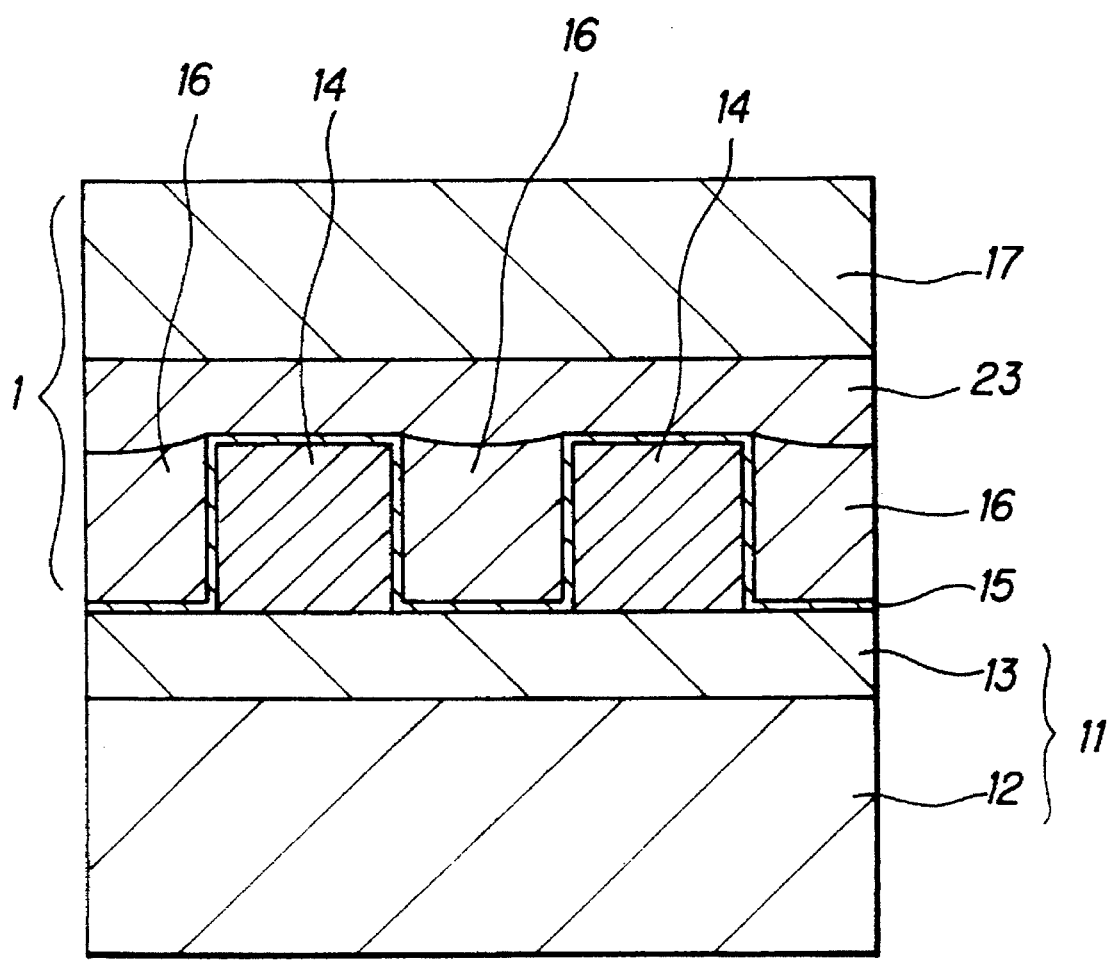
FIG. 6 is a schematic cross-sectional view of the structure of a fourth example of the invention.

A fourth example is next described by referring to the schematic cross section of FIG. 6. In this figure, those components which are the same as their counterparts of FIG. 2 are indicated by the same reference numerals.

As shown in FIG. 6, this interlayer dielectric film structure is similar to the structure shown in FIG. 2 except that a fifth dielectric film 23 is formed over the conductive interconnects 14 via the first dielectric film 15. In this example, the fifth dielectric film 23 is formed also over the second dielectric film 16. The thickness of the fifth dielectric film 23 is more than 10% and less than 30% of the height of the conductive interconnects 14. The fifth dielectric film 23 has substantially the same relative dielectric constant as the second dielectric film 16 described in the first example. The fifth dielectric film 23 consists, for example, of at least one of silicon oxide containing fluorine, polysiloxane materials, polyparaxylylene, fluorocarbon materials, and polyimide materials.

For instance, where the height of the conductive interconnects 14 is 600 nm, the fifth dielectric film 23 is formed to a film thickness of 100 nm, for example. In this case, it accounts for about 17% of the film thickness of the conductive interconnects 14. The structure is the same as the structure described already in connection with FIG. 2 in other respects.

That is, the base or main body 11 consists of the semiconductor substrate 12 having the lower dielectric layer 13 formed on its surface. The conductive interconnects 14 are formed over the lower dielectric layer 13. The first dielectric film 15 is formed so as to cover the conductive interconnects 14. The upper dielectric layer 17 is formed over the first and second dielectric films 15, 16, respectively, via the fifth dielectric layer 23. The interlayer dielectric film 1 is constructed in this way.

The method of fabrication of the interlayer dielectric film structure of the above-described fourth example is carried out by a process similar to the process described in the first example. However, the difference with the process of the first example is that the second dielectric film 16 is left over the conductive interconnects 14 via the first dielectric film 15 when the second dielectric film 16 is etched back. That is, the second dielectric film 16 is left up to a thickness which is more than 10% and less than 30% of the height of the conductive interconnects 14. The left second dielectric film 16 becomes the fifth dielectric film 23. Therefore, the fifth dielectric film 23 consists of a polysiloxane based polymer, in the same way as the second dielectric film 16.

Alternatively, the fifth film is made of silicon oxide containing fluorine carbon, poly-paraxylylene, a fluorocarbon material, or a polyimide material such as polyimide.

In the fourth example described above, the fifth dielectric film 23 is formed over the conductive interconnects 14 via the first dielectric film 15 and so the conductive interconnects 14 are protected from corrosion and poisoned vias due to the fifth dielectric film 23 of low dielectric constant. Because the thickness of the height of the conductive interconnects is more than 10% and less than 30% of the height of the conductive interconnects, 14 and because the fifth dielectric film 23 having substantially the same relative dielectric constant as the second dielectric film 16 is formed, the electric field generated by the conductive interconnects 14 passes through the fifth dielectric film 23 of low dielectric constant. In consequence, the capacitance between the conductive interconnects 14 is reduced.

If the thickness of the fifth dielectric film 23 is lower than 10% of the height of the conductive interconnects 14, the electric field developed by the conductive interconnects 14 hardly passes through the fifth dielectric film 23 but passes through the upper dielectric layer 17. Consequently, the capacitance is reduced less efficiently. On the other hand, if the thickness is in excess of 30%, the moisture resistance is adversely affected, because the film quality of the fifth dielectric film 23 is poor. When a thermal step is effected, if the fifth dielectric film 23 contains carbon, hydrocarbon gases are produced. This renders the film porous. For this reason, the moisture resistance is further deteriorated. Accordingly, the film thickness is set to the above-described range.

Figure 7:
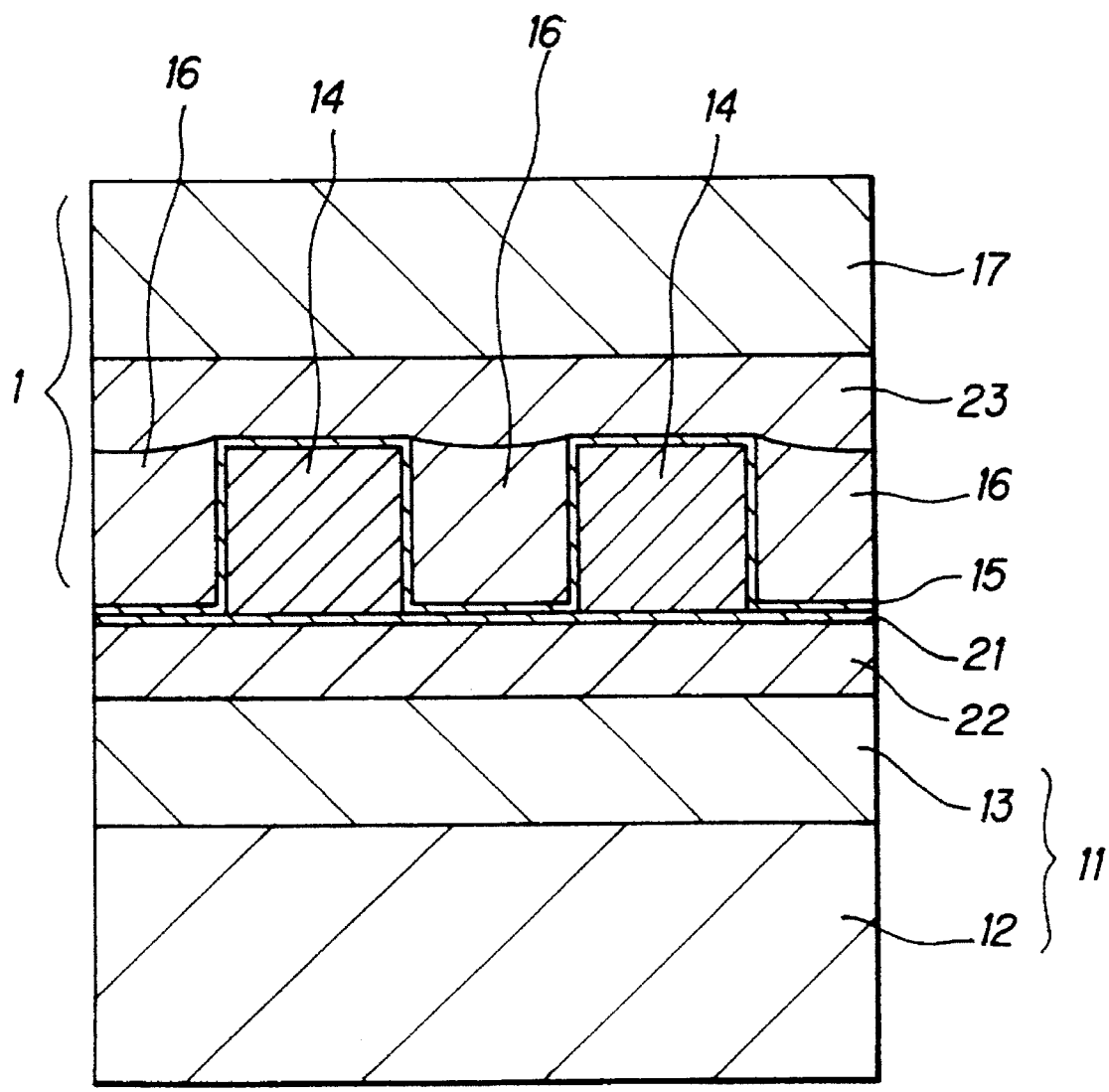
FIG. 7 is a schematic cross-sectional view of the structure of a fifth example of the invention.

A fifth example which is a combination of the third example and the fourth example described above is next described by referring to the schematic cross section of FIG. 7. In this figure, those components which are the same as their counterparts of FIGS. 4 and 6 are indicated by the same reference numerals.

As shown in FIG. 7, this interlayer dielectric film structure combines the structure shown in FIG. 4 with the structure shown in FIG. 6. That is, a fourth dielectric film 22 and a third dielectric film 21 are formed over the lower dielectric layer 13 of the base 11. Conductive interconnects 14 are formed over the third dielectric film 21. Therefore, the third dielectric film 21 and the fourth dielectric film 22 are formed under the conductive interconnects 14.

The third dielectric film 21 is made of a material having substantially the same relative dielectric constant as the first dielectric film 15, e.g., silicon oxide, silicon oxynitride, or silicon nitride. The thickness of the fourth dielectric film 22 is more than 10% and less than 30% of the height of the conductive interconnects 14. The fourth dielectric film 22 has substantially the same relative dielectric constant as the second dielectric film 16 described in the first example. This fourth dielectric film 22 consists, for example, of at least one of silicon oxide containing fluorine, polysiloxane materials, polyparaxylylene, fluorocarbon materials, and polyimide materials.

The conductive interconnects 14 are coated with the first dielectric film 15. The second dielectric film 16 similar to that described in the first example is formed between the conductive interconnects 14 via the first dielectric film 15 similar to that described in the first example. A fifth dielectric film 23 is formed over the conductive interconnects 14 via the first dielectric film 15. This fifth dielectric film 23 is formed also over the second dielectric film 16.

The thickness of the fifth dielectric film 23 is more than 10% and less than 30% of the height of the conductive interconnects 14. The fifth dielectric film 23 has substantially the same relative dielectric constant as the second dielectric film 16. This fifth dielectric film 23 consists, for example, of at least one of silicon oxide containing fluorine, polysiloxane materials, polyparaxylylene, fluorocarbon materials, and polyimide materials.

The upper dielectric layer 17 consisting, for example, of silicon oxide is formed over the fifth dielectric film 23. The interlayer dielectric film 1 is constructed in this way.

For instance, where the height of the conductive interconnects 14 is 600 nm, the third dielectric film 21 is formed to a film thickness of 10 nm, for example. The fourth dielectric film 22 is formed to a film thickness of 100 nm. The fifth dielectric film 23 is formed to a film thickness of 100 nm. In this case, the film thicknesses of the fourth and fifth dielectric films 22 and 23 account for about 17% of the film thickness of the conductive interconnects 14.

In the method of fabricating the interlayer dielectric film structure of the fifth example, the fourth dielectric film 22, the third dielectric film 21, and the conductive interconnects 14 are formed by a process similar to the process described in the third example. Then, the first dielectric film 15 is formed. Thereafter, the second dielectric film 16 and the fifth dielectric film 23 are formed integrally by a process similar to the process described in the fourth example. Subsequently, the upper dielectric layer 17 is formed.

In the above-described fifth example, the fourth dielectric film 22 is formed under the conductive interconnects 14 via the third dielectric film 21. The second dielectric film 16 is formed over the conductive interconnects 14 via the first dielectric film 15. Consequently, the capacitance between the conductive interconnects 14 is made lower than in the third and fourth examples.

Figure 8A:
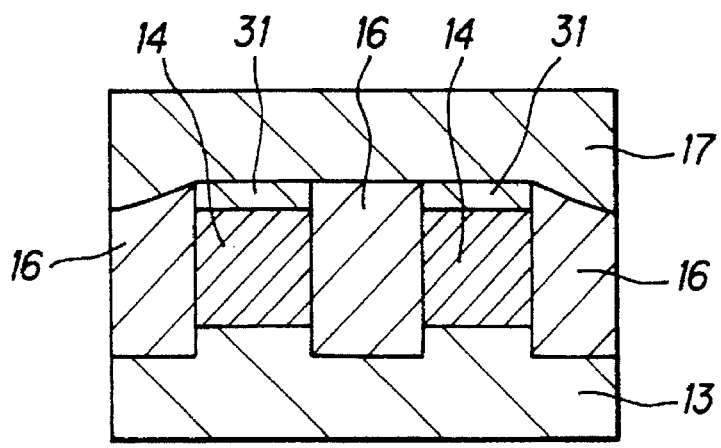
FIG. 8A is a cross-sectional view of the prior art interlayer dielectric film structure, illustrating the effect of reduction of the capacitance between conductive interconnects.
Figure 8B:
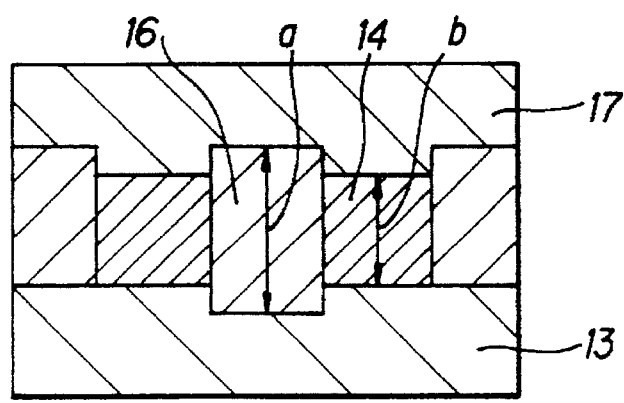
FIG. 8B is a cross-sectional view similar to FIG. 8A, but illustrating the manner in which the jut-out ratio of the low dielectric electric constant material in the interlayer dielectric film structure is found.
Figure 8C:
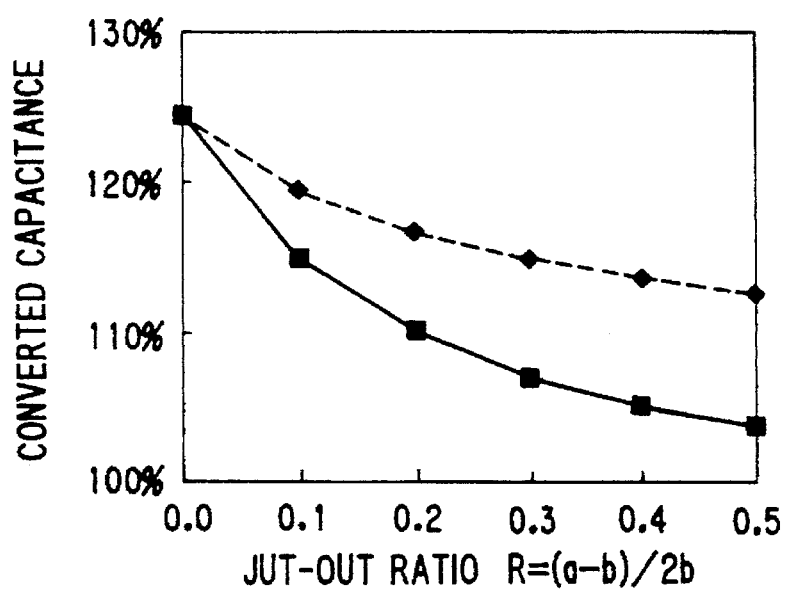
FIG. 8C is a graph comparing the effect of reduction of the capacitance between conductive interconnects obtained by the present invention with the effect of reduction of the capacitance between conductive interconnects obtained by the prior art interlayer dielectric film structure.

The effect of reduction of the capacitance between the conductive interconnects is next described by referring to FIGS. 8(a)–8(c). FIG. 8(a) illustrates the manner in which the jut-out ratio of a low dielectric constant substance in an interlayer dielectric film structure is found. In this figure, those components which are the same as their counterparts of the above examples are indicated by the same reference numerals. FIG. 8(b) illustrates the manner in which the jut-out ratio of the low dielectric constant body in an interlayer dielectric film structure is found. In this figure, those components which are the same as their counterparts of the above examples are indicated by the same reference numerals. Plotted on the vertical axis of FIG. 8(c) is converted capacitance when the conductive interconnects (aluminum interconnects, in this example) are coated with a dielectric film having a relative dielectric constant of 2.5 and when the capacitance between the conductive interconnects is taken as 100%. Plotted on the horizontal axis is the jut-out ratio of the low dielectric constant body.

First, the prior art interlayer dielectric structure is described. As shown in FIG. 8(a), a plurality of conductive interconnects 14 are formed to a thickness of 600 nm over the lower dielectric layer 13 made of silicon oxide and having a relative dielectric constant of 4.0. A silicon oxide film 31 having a thickness of 200 nm and a relative dielectric constant of 4.0 is formed over the conductive interconnects 14. The lower dielectric layers 13 which are located on both sides and over which the conductive interconnects 14 are formed are lower by 200 nm than those portions in which the conductive interconnects 14 are formed. The second dielectric film 16 consisting of a low dielectric constant substance polyimide (relative dielectric constant is approximately equal to 3.0) is formed on both sides of the conductive interconnects 14 and the silicon oxide film 31. The upper dielectric layer 17 having a relative dielectric constant of 4.0 is formed over the silicon oxide film 31 and over the second dielectric film 16. The upper dielectric layer 17 is formed by plasma CVD, using tetraethoxysilane as a raw material. In this way, an interlayer dielectric film is formed by the second dielectric film 16, the silicon oxide film 31, and the upper dielectric film 17.

The manner in which the jut-out ratio of the low dielectric constant body of the interlayer dielectric film structure is found is next described. As shown in FIG. 8(b), the conductive interconnects 14 having a height of b are formed over the lower dielectric layer 13 having a relative dielectric constant of 4.0. The second dielectric film 16 consisting of a low dielectric substance and having a height of a is formed between the conductive interconnects 14. The upper dielectric layer 17 having a relative dielectric constant of 4.0 is formed over the conductive interconnects 14 and over the second dielectric film 16. The first dielectric film described in the above examples is not shown in this figure.

The jut-out ratio R of the second dielectric film 16 relative to the conductive interconnects 14 is calculated to be R=(a−b)/2b.

Where the fourth and fifth dielectric films becoming a low dielectric constant body described in the third, fourth, and fifth examples are formed over or under the conductive interconnects 14, the calculated film thickness of the second dielectric film includes the film thicknesses of the fourth and fifth dielectric films.

The results of the calculated capacitance between the conductive interconnects are described with reference to FIG. 8(c), where the converted capacitance of the prior art interlayer dielectric film structure shown in FIG. 8(a) is indicated by the broken line, while the converted capacitance of the structure of the fifth example is indicated by the solid line.

As shown, in the structure of the fifth example where the fourth and fifth dielectric films of a low dielectric constant substance are formed under and over the conductive interconnects, the jut-out ratio R is in the range from 0.1 to 0.3. This shows that the capacitance between the conductive interconnects is reduced by at least 4–7% compared with the prior art structure.

Although not illustrated, the reduction ratio of the converted capacitance between the conductive interconnects of the third and fourth examples described above is about half the reduction ratio of the converted capacitance of the fifth example.

Figure 9:
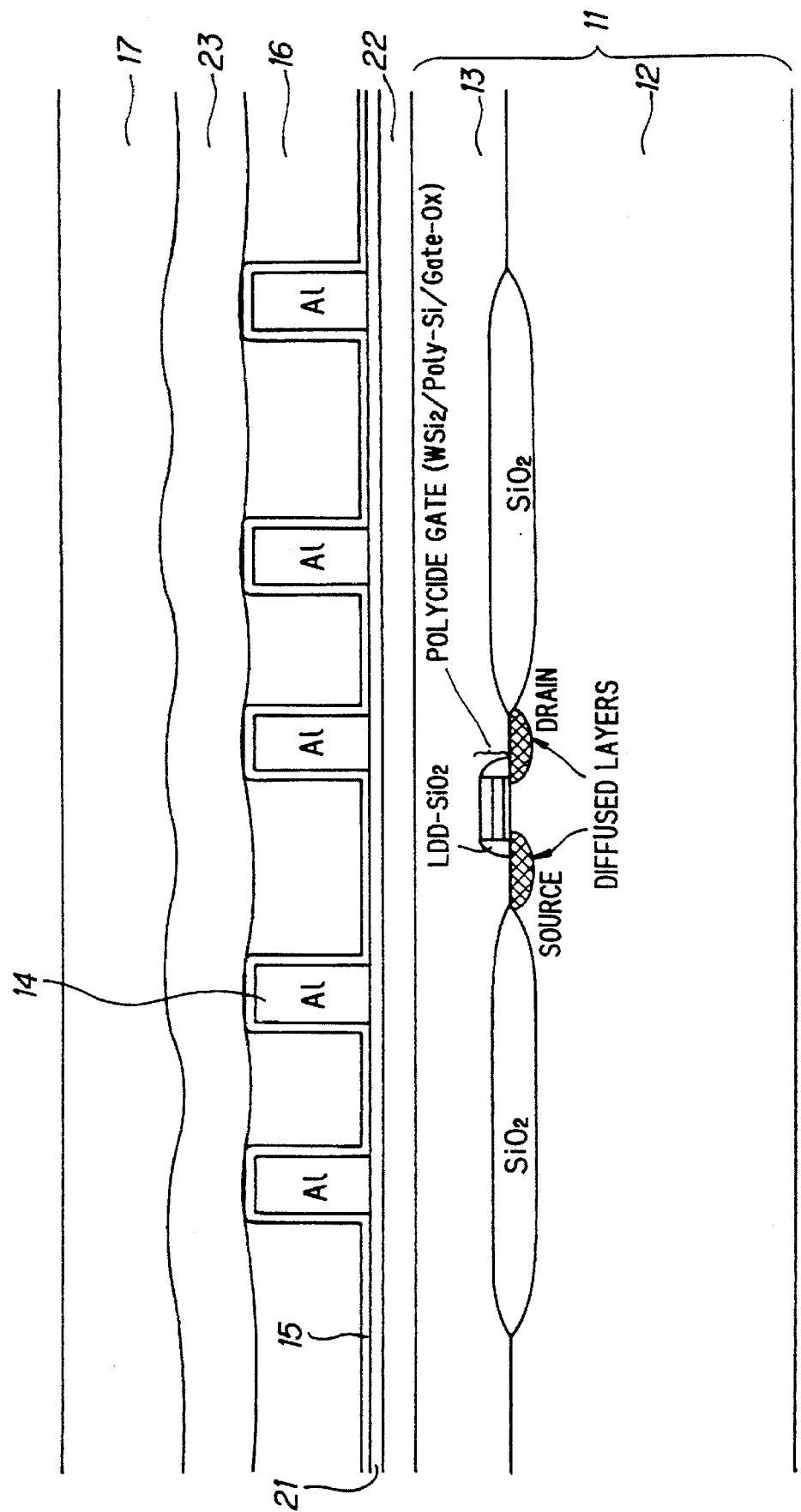
FIG. 9 is a schematic cross-sectional view of a semiconductor device to which the fifth example of the invention is applied.

An example in which the fifth example of the invention is applied to an ordinary polycide gate MOS transistor is described by referring to FIG. 9. For simplicity, the structure of FIG. 9 is compared with the structure of FIG. 7 which is a schematic cross section of the fifth example of the invention.

In FIG. 9, the polycide gate MOS transistor corresponds to the semiconductor substrate 12 shown in FIG. 7. The method of fabricating the polycide gate MOS transistor is not described herein. The silicon oxide film 13 formed on the surface of the polycide gate MOS transistor corresponds to the lower oxide film 13 shown in FIG. 7. The fourth dielectric film 22 of a low dielectric constant is formed on the silicon oxide film 13. Thereafter, the third dielectric film 21 is formed on the fourth dielectric film 22. Subsequently, in order to form the plural Al interconnects 14, aluminum is deposited. This aluminum film is patterned, making use of a photolithography step and an etching step. Thus, the conductive interconnects 14 are formed.

Then, the first dielectric film 15 is formed and the second dielectric film 16 is buried on the principle of the fifth example of the invention. This is followed by formation of the fifth dielectric film 23 and the upper dielectric layer 17. The manner in which these films are formed has been already described in the fifth example.

What is claimed is:

1. An interlayer dielectric film structure, for a semiconductor device, comprising:

a substrate made from a semiconductor material;

said semiconductor device fabricated from said substrate by semiconductor fabrication processes;

a main body formed by said semiconductor device and comprising a first dielectric film and a second dielectric film, at least a surface of said main body being insulative;

conductive interconnects formed on said main body;

said first dielectric film being formed so as to cover said conductive interconnects; and said second dielectric film having a relative dielectric constant smaller than that of said first dielectric film, said second dielectric film existing at least between said conductive interconnects via said first dielectric film;

wherein said second dielectric film between said conductive interconnects has a thickness larger than a height of the conductive interconnects by 10 to 100% in directions of height and depth.

2. An interlayer dielectric film structure, for a semiconductor device, comprising:

a substrate made from a semiconductor material;

said semiconductor device fabricated from said substrate by semiconductor fabrication processes;

a main body formed by said semiconductor device and comprising a first dielectric film and a second dielectric film, at least a surface of said main body being insulative;

conductive interconnects formed on said main body;

said first dielectric film being formed so as to cover said conductive interconnects;

said second dielectric film having a relative dielectric constant smaller than that of said first dielectric film, said second dielectric film existing at least between said conductive interconnects via said first dielectric film;

a third dielectric film having substantially the same relative dielectric constant as said first dielectric film and formed under said conductive interconnects; and a fourth dielectric film having a thickness that is more than 10% and less than 30% of the height of said conductive interconnects, said fourth dielectric film having substantially the same relative dielectric constant as said second dielectric film, said fourth dielectric film being formed under said third dielectric film.

3. The interlayer dielectric film structure of claim 2, wherein said third dielectric film consists of at least one of silicon oxide, silicon oxynitride, and silicon nitride, and wherein said fourth dielectric film consists of at least one of silicon oxide containing fluorine, polysiloxane materials, polyparaxylylene, fluorocarbon materials, and polyimide materials.

4. An interlayer dielectric film structure for a semiconductor device, comprising:

a substrate made from a semiconductor material;

said semiconductor device fabricated from said substrate by semiconductor fabrication processes;

a main body formed by said semiconductor device and comprising a first dielectric film and a second dielectric film, at least a surface of said main body being insulative;

conductive interconnects formed on said main body;

said first dielectric film being formed so as to cover said conductive interconnects;

said second dielectric film having a relative dielectric constant smaller than that of said first dielectric film, said second dielectric film existing at least between said conductive interconnects via said first dielectric film; and a fifth dielectric film having a thickness which is more than 10% and less than 30% of the height of said conductive interconnects, said fifth dielectric film having substantially the same relative dielectric constant as said second dielectric film, said fifth dielectric film being formed over said conductive interconnects via said first dielectric film.

5. The interlayer dielectric film structure of claim 4, wherein said fifth dielectric film consists of at least one of silicon oxide containing fluorine, polysiloxane materials, polyparaxylylene, fluorocarbon materials, and polyimide materials.

6. The interlayer dielectric film structure of claim 1, wherein said first dielectric film consists of at least one of silicon oxide, silicon oxynitride, and silicon nitride.

7. The interlayer dielectric film structure of claim 1, wherein said second dielectric film consists of at least one of silicon oxide containing fluorine, polysiloxane materials, polyparaxylylene, fluorocarbon materials, and polyimide materials.

8. The interlayer dielectric film structure of claim 2, wherein said first dielectric film consists of at least one of silicon oxide, silicon oxynitride, and silicon nitride.

9. The interlayer dielectric film structure of claim 2, wherein said second dielectric film consists of at least one of silicon oxide containing fluorine, polysiloxane materials, polyparaxylylene, fluorocarbon materials, and polyimide materials.

10. The interlayer dielectric film structure of claim 4, wherein said first dielectric film consists of at least one of silicon oxide, silicon oxynitride, and silicon nitride.

11. The interlayer dielectric film structure of claim 4, wherein said second dielectric film consists of at least one of silicon oxide containing fluorine, polysiloxane materials, polyparaxylylene, fluorocarbon materials, and polyimide materials.

12. An interlayer dielectric film structure for a semiconductor device, comprising:

a semiconductor substrate on which a lower dielectric layer is formed;

a plurality of conductive interconnects formed over the lower dielectric layer;

a first dielectric film formed to cover the conductive interconnects;

a second dielectric film having a relative dielectric constant smaller than that of the first dielectric film and formed between the conductive interconnects via the first dielectric film and formed between each conductive interconnect;

the second dielectric film between said conductive interconnects having a thickness larger than a height of the conductive interconnects by 10 to 100% in directions of height and depth.

13. The interlayer dielectric film structure for a semiconductor device as set forth in claim 12, wherein a base comprises said semiconductor substrate and said plurality of conductive interconnects are formed over the lower dielectric layer of the base.

14. The interlayer dielectric film structure for a semiconductor device as set forth in claim 12 where the lower dielectric layer consists of silicon oxide.

15. The interlayer dielectric film structure for a semiconductor device as set forth in claim 12, wherein said first dielectric film consists of at least one of silicon oxide, silicon oxynitride, and silicon nitride.

16. The interlayer dielectric film structure for a semiconductor device as set forth in claim 12, wherein said second dielectric film consists of at least one of silicon oxide containing fluorine, polysiloxane materials, polyparaxylylene, fluorocarbon materials, and polyimide materials.

17. The interlayer dielectric film structure for a semiconductor device as set forth in claim 12, wherein the second dielectric film is formed over the lower dielectric layer which is on one side of the conductive interconnects via the first dielectric film.

18. The interlayer dielectric film structure for a semiconductor device as set forth in claim 12, wherein the second dielectric film is formed directly on the lower dielectric layer.

19. The interlayer dielectric film structure for a semiconductor device as set forth in claim 12, further comprising an upper dielectric layer formed over the first and second dielectric films respectively.

20. The interlayer dielectric film structure as set forth in claim 19, wherein said upper dielectric layer consists of silicon oxide.

21. The interlayer dielectric film structure for a semiconductor device, as set forth in claim 12, further including a third dielectric film having substantially the same relative dielectric constant as said first dielectric film and formed under said conductive interconnects; and a fourth dielectric film having substantially the same relative dielectric constant as said second dielectric film, said fourth dielectric film being formed under said third dielectric film.

22. The interlayer dielectric film structure as set forth in claim 21, wherein said fourth dielectric film has a thickness that is more than 10% and less than 30% of the height of said conductive interconnects.

23. The interlayer dielectric film structure of claim 22, wherein said third dielectric film consists of at least one of silicon oxide, silicon oxynitride, and silicon nitride, and wherein said fourth dielectric film consists of at least one of silicon oxide containing fluorine, polysiloxane materials, polyparaxylylene, fluorocarbon materials, and polyimide materials.

24. The interlayer dielectric film structure of claim 21, wherein said fourth dielectric film consists of at least one of silicon oxide containing fluorine, polysiloxane materials, polyparaxylylene, fluorocarbon materials, and polyimide materials.

25. The interlayer dielectric film structure of claim 21, wherein said first dielectric film and said third dielectric film are formed to surround the conductive interconnects.

26. The interlayer dielectric film structure of claim 21, further including a fifth dielectric film formed over the conductive interconnects via the first dielectric film.

27. The interlayer dielectric film structure of claim 22, wherein the thickness of the fifth dielectric film is more than 10% and less than 30% of the height of the conductive interconnects and has substantially the same relative dielectric constant as the second dielectric film.

28. The interlayer dielectric film structure of claim 22, wherein the fifth dielectric film consists of at lest one of silicon oxide containing fluorine, polysiloxane materials, polyparaxylylene, fluorocarbon materials, and polyimide materials.

* * * * *